(12) United States Patent
Zhou et al.

(10) Patent No.: US 6,777,145 B2
(45) Date of Patent: Aug. 17, 2004

(54) IN-LINE FOCUS MONITOR STRUCTURE AND METHOD USING TOP-DOWN SEM

(75) Inventors: Wen-Zhan Zhou, Singapore (SG); Hui-Kow Lim, Singapore (SG); Teng Hwee Ng, Singapore (SG); Ron Lopez, Singapore (SG); Goswami Indranil, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 210 days.

(21) Appl. No.: 10/158,469

(22) Filed: May 30, 2002

(65) Prior Publication Data

US 2003/0224252 A1 Dec. 4, 2003

(51) Int. Cl.[7] .............................. G03F 9/00; H01L 23/58
(52) U.S. Cl. .............................. 430/30; 430/5; 430/296; 430/942; 430/967; 257/48
(58) Field of Search .............................. 430/5, 30, 296, 430/942, 967; 257/48

(56) References Cited

U.S. PATENT DOCUMENTS 6,063,531 A    5/2000 Singh et al. .................. 430/30
6,094,256 A    7/2000 Grodnensky et al. ......... 355/77
6,320,648 B1  11/2001 Brueck et al. ................. 355/67

OTHER PUBLICATIONS

Proc. of SPIE, vol. 3998, Metrology, Inspection, and Process Control for Micro lithography XIV, ( Mar. 2000), "Shape Control Using Sidewall Imaging," by Bo Su et al., pp. 232–238.

*Primary Examiner*—Christopher G. Young
(74) *Attorney, Agent, or Firm*—George O. Saile; Rosemary L. S. Pike

(57) ABSTRACT

The present invention relates to a test structure which is formed on a reticle simultaneously with a pattern that will be used to build an integrated circuit device. The test structure comprises a large rectangular end and several rectangular shapes that extend from one side of the rectangular end in a parallel array. The width of the rectangular shape extensions is equal to the spacing between them and is the same as the width of the minimum feature size in the lithographic process to be monitored. A CD SEM is used to measure the edge width of the convex and concave sections of the structure as printed in photoresist at various focus settings and a plot of edge width vs. focus setting is generated. The intersection of the lines representing the convex section and concave section measurements indicates the best focus setting for the lithographic process.

26 Claims, 5 Drawing Sheets

IN-LINE FOCUS MONITOR STRUCTURE AND METHOD USING TOP-DOWN SEM

FIELD OF THE INVENTION

The present invention relates to the manufacture of integrated circuit devices. In particular, the present invention is a structure on a reticle which is used to control a lithography process such that the best focus for imaging is constantly maintained. The present invention is also a method by which the structure is used to determine best focus.

BACKGROUND OF THE INVENTION

The manufacture of integrated circuits is a highly complex process requiring constant improvements in exposure and etching tools, reticles, photoresist, measurement tools and other processing equipment. As the size of devices shrinks and circuits become more densely packed to provide greater performance, the critical dimension of structures in state of the art devices is rapidly approaching 100 nm (0.1 microns). For some advanced products in development, the critical dimension of the smallest feature is already in the sub-100 nm region.

Improvements in exposure tools consist of shifting to shorter exposure wavelengths to enable printing of smaller features according to the Raleigh resolution equation: $CD=k\lambda/NA$, where CD is the lateral dimension of the feature to be printed in the photoresist, k is a constant, $\lambda$ is the wavelength of exposing energy, and NA is the numerical aperture of the exposure tool. During the past 20 years, the exposure wavelength has decreased from over 400 nm to 193 nm. In the same period, the energy source has changed from a mercury lamp emitting broadband light to a laser that emits a very narrow wavelength. It should be noted that multiple feature sizes on various levels of a device are required during production. Thus, a larger dimension on one level may be printed with longer wavelength from one tool while a small feature on a different level may be printed with a shorter wavelength from a second exposure tool. In general, the longer wavelength exposure tools are more mature and more cost effective and are used unless they are not capable of printing the finer dimensions which are needed in newer technologies.

Those skilled in the art will appreciate that other energy sources are also capable of imaging photoresist in a production mode and may be included within the scope of this invention. Electron beam, X-ray, extreme UV (EUV), or ion beam sources may be employed for lithography.

U.S. Pat. No. 6,320,648 describes a method and apparatus for improving pattern fidelity in the imaging process but is directed toward transmitting a pattern from a reticle to a wafer and does not relate to process control during production of a device.

The reticle or mask is generally comprised of a quartz plate which is highly transparent to the exposing radiation and a chrome coating which has been deposited and patterned on one of the two large sides during the mask making process. The chrome is opaque to the radiation from the exposure tool during the photoresist imaging process. This property allows the pattern on the reticle to be transferred into the photoresist film on a wafer. Thus, the imaging radiation passes through areas on the reticle not covered by chrome and exposes the photoresist film. Because of the projection optics, the size of the feature on the reticle is typically 4 or 5 times larger than the same feature which is focused on the wafer and printed in the photoresist. A 1 micron by 1 micron wide opening in the chrome on the reticle would translate to a 0.2 micron by 0.2 micron wide area exposed in the photoresist in a 5× reduction system.

Reticles can be bright field or dark field. Bright field reticles typically have a large portion of the quartz not covered by chrome such that up to 45% of more of the incident light passes through the plate. On the other hand, dark field reticles have a large portion of the quartz covered by chrome so that only about 10% of the incident energy is transmitted through the plate. The type of reticle could have an effect on the imaging performance of the photoresist such as the shape of the profile produced. Recent advances in mask making involve the addition of phase shifting materials to the reticle in order to improve the imaging performance of the lithography process.

A photoresist is generally composed of a polymer, photoactive compound, solvent, and may include additives to improve performance or film quality. The photoresist is coated on a substrate such as a wafer and baked to form a film normally between 0.2 and 2 microns thick. For positive tone photoresist, the exposed area becomes soluble in aqueous base developer while the unexposed regions remain insoluble in developer. With negative tone photoresist, the exposed area becomes crosslinked or is otherwise rendered insoluble in aqueous base developer while the unexposed regions dissolve in developer and are washed away. Organic solvents could be used as developers but are not preferred because of flammability and cost concerns.

In the ideal lithography system, the pattern on the reticle is focused by the projection optics of the exposure tool at or near the surface of the photoresist film. In actual practice, the focal point may be above or below the surface of the photoresist because of temperature or pressure drifts, wafer flatness variations or other factors. Since the amount of focus shift or defocus can have a dramatic effect on the size of the printed feature, it is critical to be able to control the process such that the focus is kept within a usable range for each wafer. The usable focus range or depth of focus (DOF) is defined as the range of focus settings wherein the lateral dimension of the printed feature or the space between features lies within a specification which is typically ±10% of a targeted linewidth or CD. The usable process window is a combination of the DOF and exposure range that keeps the printed feature within ±10% of a target CD.

The CD of a printed feature on a wafer is most accurately determined by cleaving the wafer and using a scanning electron microscope (SEM) to observe the feature at an angle with a side view. The SEM instrument is calibrated so that a cursor of known length is superimposed on the printed feature to determine the width of the photoresist profile or the space between two photoresist features. This cross sectional view is valuable because it also provides a picture of the shape of the resist profile that can vary from tapered to vertical or reentrant as depicted in FIGS. 3A–3C. However, this method is time consuming and is normally used only for development purposes. It is not compatible with a high throughput production line where a wafer can be exposed in less than a minute and rapid analysis is necessary.

Therefore, improved methods are needed by which feature sizes on wafers can be measured with a minimum amount of disruption and cost to the process flow. An alternative to SEM is atomic force microscopy (AFM) but the cost is high since it must be used off-line and cannot be implemented in mass production. A tilted SEM method to measure sidewall angle of resist patterns and to monitor focus drift has been tested by researchers but is difficult to implement on manufacturing measurement tools. This method has been published in SPIE Proceedings, Metrology, Inspection and Process Control for Microlithography XIV, Vol. 3998, pages 232–238 (2000).

One instrument that is currently widely used in the manufacturing line is a CD-SEM. This technique is non-destructive to the wafer and involves a scanning electron microscope which takes a top-down view of the photoresist pattern. When viewed by this method, the photoresist feature has a darker center portion and a lighter outer portion at the edge of the feature. This top-down measurement of feature size must be correlated to a cross sectional SEM measurement to determine an offset of the top-down size to the actual physical size. The quality of the CD-SEM results depends on the shape of the photoresist profiles. Measurements of vertical profiles can be easily correlated to those from cross sectional views because the outer edge of the CD-SEM image appears as a thin white line and represents the actual edge of the profile. The main limitation of top-down CD-SEM is that it cannot detect a re-entrant profile as shown in FIG. 3c which normally occurs with an exposure shift to negative defocus. In this case, the measurement is done at the top edge of the feature and the location of the bottom edge cannot be determined. For tapered profiles as in FIG. 3b, the CD-SEM usually measures a CD at the bottom edge of the profile. It is desirable to have a method for monitoring best focus that is not dependent on the type of photoresist profile to be evaluated and enables a relatively rapid throughput that can be achieved with a CD-SEM or a similar measurement technique.

Test structures have been used as a means of monitoring focus and dose control. U.S. Pat. No. 6,063,531 describes a unique test structure on a reticle. However, the resulting printed pattern images are evaluated with an angled SEM or with AFM which have been discussed previously as not compatible with high throughput manufacturing. U.S. Pat. No. 6,094,256 describes a test structure and method requiring a double exposure and a rotation of the reticle between the first and second exposures. This technique requires more process time because of a second exposure. There is also concern about overlay of the second exposure pattern on the first exposure pattern. About half of the normal imaging dose is used for each step and this could lead to a greater error in reproducing the actual dose used in production in cases where the imaging dose is relatively low. For example, certain lasers may have a significant amount of error in reproducing two 5 milliJoule/cm$^2$ doses to give 10 mJ/cm$^2$ in the overlap exposure region. The ability of a laser to accurately deliver a 10 mJ/cm$^2$ dose is much more reliable with a single exposure than from two 5 mJ/cm$^2$ exposures. Since dose has a large effect on CD of the printed image, small dose fluctuations with this method could lead to a change in CD that might falsely be attributed to a focus drift.

An improved test structure that can be readily and accurately exposed and easily measured by CD-SEM or other means is desirable for monitoring focus and improving throughput in a production line.

SUMMARY OF THE INVENTION

An objective of the present invention is to provide a test monitor structure on a reticle that will allow a rapid determination of optimum focus conditions during a lithographic process in a manufacturing environment.

A further objective is to provide a method for determining optimum focus conditions during a lithographic process in a production mode, said method comprising the test monitor structure of the present invention.

These objectives are achieved with a focus monitor structure that is included in the pattern design of the features needed to produce an integrated circuit but it is positioned in an area that does not affect the performance of the device. The structure is patterned on a reticle simultaneously with the features that are required for the device pattern. The structure consists of a large rectangular end and several smaller rectangular shapes protruding from one side of the large rectangular end. Preferably, the length of the smaller rectangular shapes are more than five times their width. The width of the smaller rectangular shapes is equal to the spacing between the shapes and these dimensions are approximately equal to the minimum feature size in the device pattern on the reticle. One of the critical sections of the structure which is repeated at several places on the structure is called a convex section which is a region near the end of the protruding rectangular shapes. A second critical section of the structure that is repeated at several places is called a concave section which is a region where a protruding rectangular shape intersects with the large rectangular end.

To those skilled in the art, it will be apparent that this test structure may be useful with bright field, dark field, or phase shifting masks or with reticles designed for other radiation sources. The test structure is applicable to lithographic processes involving positive or negative photoresist, bilayer, multilayer or surface imaging resist and may be useful with all radiation wavelengths used in the art.

There may be several test monitor structures on each reticle and they may be located at different positions within the device pattern. Preferably, several structures will be arranged in groups so that they are easily detected and identified when observed with a CD-SEM in a manufacturing environment.

In another embodiment, the present invention is a method for monitoring focus in a lithographic process comprising: (a) coating a photoresist on a substrate and baking to form a film; (b) exposing said film with radiation that passes through a reticle containing the test monitor structure of the present invention in a lithographic pattern; (c) developing the photoresist wafer to reproduce the device pattern and structure from the reticle; (d) measuring the edge width of at least one convex and one concave section of the test structure with a CD-SEM; and (e) determining the intersection of a line representing the concave section measurements and a line representing the convex section measurements in a plot of edge width as a function of exposure focus settings used to print the pattern.

BRIEF DESCRIPTION OF THE DRAWINGS

FIG. 3A shows a vertical profile while FIG. 3B illustrates a tapered profile and FIG. 3C shows a reentrant profile.

DETAILED DESCRIPTION OF THE INVENTION

The present invention relates to a method of process control during the manufacture of integrated circuits, said method comprising a test monitor structure which is included in a pattern on a reticle and is transferred into the photoresist film by exposing radiation and subsequent development of the photoresist layer. The invention also relates to a test monitor structure on the reticle that is printed in the photoresist and comprises concave and convex sections which are measured by a CD-SEM to determine the optimum focus setting of the lithographic process.

Figure 1:
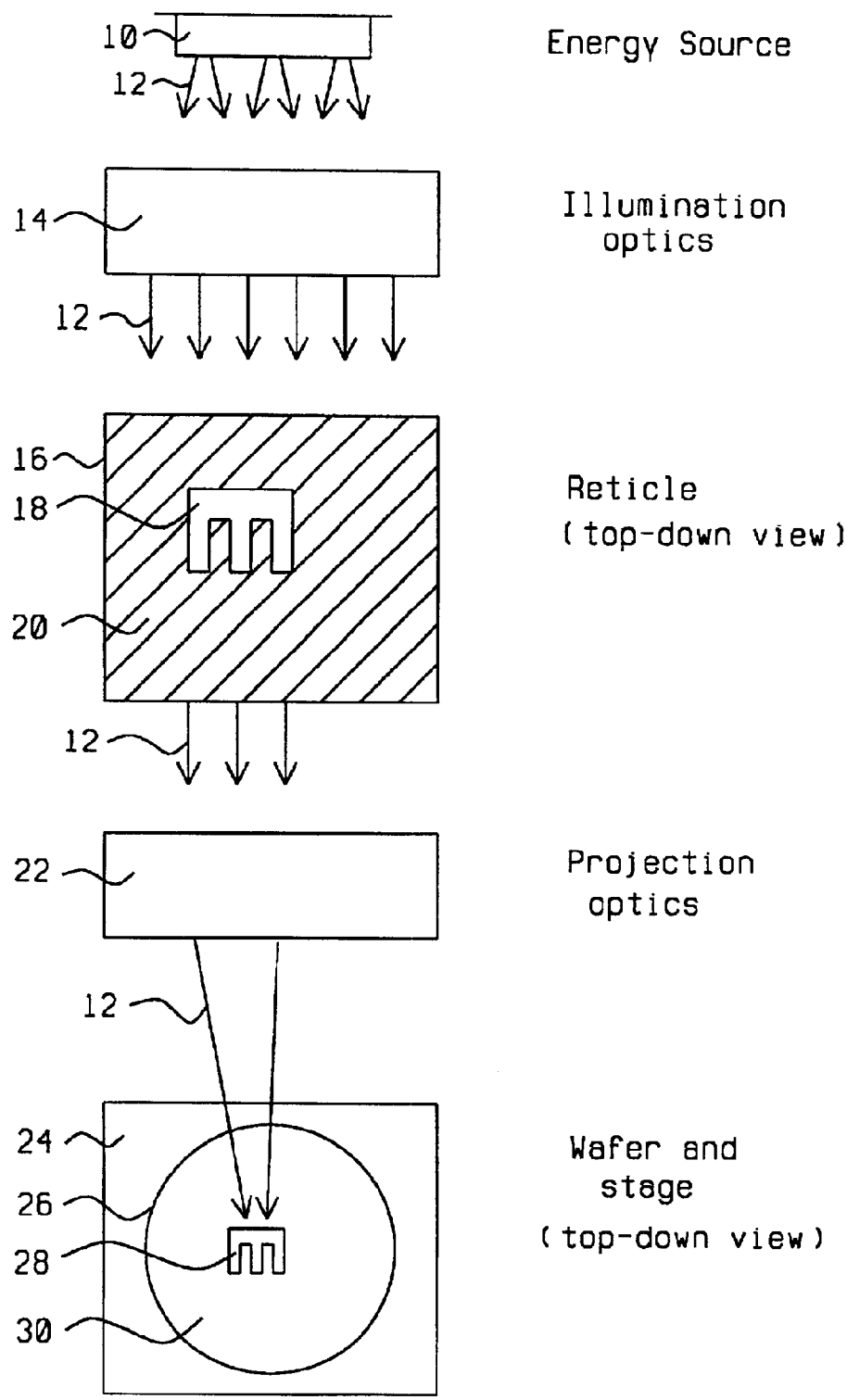
FIG. 1 is a diagram of a projection exposure system in accordance with embodiments of the present invention.

In one embodiment, the present invention is a test monitor structure on a reticle that is useful in providing a rapid determination of the optimum focus setting during a lithographic process. Referring to FIG. 1, the exposure system consists of an energy source 10, illumination optics 14, a reticle 16 containing a device pattern required to produce one layer of an integrated circuit in a device, projection optics 22, and a wafer 26 coated with photoresist that is positioned on a stage 24 in the exposure tool. The drawing is not to be considered in a limiting sense as it is understood that the present invention is not limited to the illustrated embodiments.

The energy source may be a mercury lamp emitting broadband light, a laser source emitting a very narrow wavelength of light, or other sources such as X-ray, ion beam, EUV, or electron beam. In the case of a mercury or laser source, the radiation 12 may be in the wavelength range of about 650 nm to 157 nm. Generally, as the minimum feature size in the integrated circuit device becomes smaller to provide a performance enhancement over the previous technology, the wavelength of the exposing radiation is reduced in accordance with the Raleigh equation, $CD=k\lambda/NA$, where CD is the lateral width or critical dimension of the feature to be printed in the photoresist film, k is a constant, $\lambda$ is the wavelength of exposing radiation and NA is the numerical aperture of the lens in the exposure tool. The minimum CD of state of the art devices currently in production is in the range of 130 to 180 nm (0.13 to 0.18 microns) and typically requires 193 nm or 248 nm exposure wavelengths. However, longer exposure wavelengths from 248 nm to above 400 nm may be used to pattern larger feature sizes on certain layers of the device in a more cost effective manner. It is understood that each of several layers of a device are built by first printing a unique pattern in a photoresist and then transferring the pattern into an underlying substrate. Each layer may have a different best focus setting which provides the maximum process window for the imaging step.

The illumination optics 14 typically regulate the exposing radiation 12 and direct it through a reticle or mask 16. The illumination optics are quite complex and include mirrors, lenses, filters and other components to control the radiation.

The reticle 16 consists of a quartz plate which has a chrome layer 20 on the side incident to the radiation. The mask contains a pattern 18 in the chrome that includes the test monitor structure which was formed during the mask making process. Several test monitor structures may be contained within pattern 18 but will not affect the performance of the device after the pattern is transferred into the substrate. Since the chrome areas 20 are opaque to the incident radiation and the clear areas within 18 with no chrome are transparent to the radiation, the pattern 18 on the mask is transferred through the projection optics 22 which focus the image on a photoresist film 30 contained on a substrate or wafer 26. The reticle may be bright field where a large portion of the surface is not covered with chrome or it may be dark field where most of the surface is covered with chrome. The reticle may also contain phase shifting materials that enhance the quality of the image projected onto the wafer.

The projection optics 22 contain lenses and mirrors and whatever other components are necessary to focus an image of the pattern onto the wafer surface. Increasing the numerical aperture (NA) of the lens will also reduce the printable feature size. However, there is a practical upper limit to NA of about 0.80 or 0.85. Most lenses used in a production mode have an NA between 0.6 and 0.75. As NA increases, the usable focus range (DOF) is reduced. Therefore, a high NA is not desirable in some lithographic applications where DOF may be more important than minimum feature size.

The size of the pattern 18 on the reticle is typically reduced by a factor of four or five as it is focused on the photoresist film 30 in the exposed region 28. The wafer 26 and stage 24 usually move to allow the pattern to be repeatedly exposed on several different fields or locations on the wafer such that the entire surface of the photoresist contains repeated patterns to allow for a greater number of patterns or circuits per wafer.

The photoresist film may be positive tone where the exposed regions are washed away in a developer that is typically an aqueous base. The unexposed regions remain on the wafer and serve as a mask for subsequent processing in which the pattern is transferred into underlying layers that may include oxides, nitrides or other organic materials. In the case of negative tone photoresist, the exposed regions remain on the wafer while the unexposed areas are dissolved and washed away in developer. Other photoresist materials well known in the art such as bilayer, multilayer, surface imaging, X-ray, electron beam, or ion beam materials may be used depending upon the type of exposing radiation and the composition and structure of underlying layers. The test monitor structure of the present invention is useful with any type of photoresist film.

Ideally, the pattern 18 on the reticle 16 is focused by the projection optics 22 of the exposure tool at or near the surface of the photoresist film 30. In actual practice, the focal point may be above or below the surface of the photoresist because of temperature or pressure drifts, wafer flatness variations or other factors. Since the amount of focus shift or defocus can have a dramatic effect on the size of the printed feature, it is critical to be able to control the process such that the focus is kept within a usable range for each wafer in production mode. The usable focus range or depth of focus (DOF) is defined as the range of focus settings wherein the lateral dimension of the printed feature or the space between features lies within a specification which is typically ±10% of a targeted linewidth or CD. The process window is a combination of the DOF and exposure range that keeps the printed feature within ±10% of a target CD.

The test monitor structure which has been transferred with the reticle pattern 18 into the photoresist pattern 28 on the wafer is a useful means of controlling the focus setting during the lithographic process to allow for maximum throughput of wafers.

Figure 2:
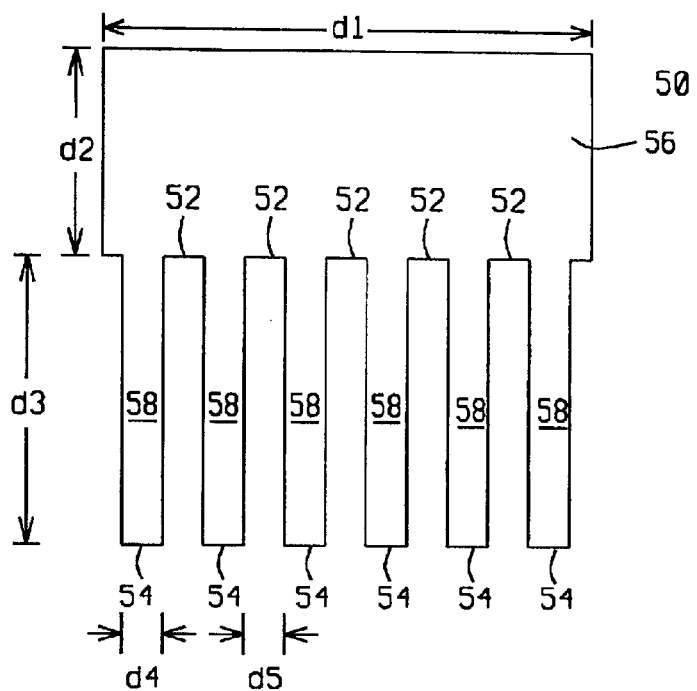
FIG. 2 depicts the shape of the test monitor structure on a reticle or mask in accordance with the present invention.

Referring to FIG. 2, the test monitor structure 50 essentially consists of a large rectangular end 56 with dimensions $d_1$ and $d_2$ and several long rectangular shapes 58 having length $d_3$ and width $d_4$ protruding from one side of the rectangular end 56. The number of shapes 58 may be as few as three whereas the maximum number is preferably seven or more to permit several measurements in the test monitor structure that is printed in a photoresist film. The long rectangular shapes 58 are separated by spaces with width $d_5$. The dimension $d_4$ is equal to $d_5$ and both are approximately equal to the size of the minimum feature in the device pattern. Rectangular end 56 and rectangular shapes 58 appear as chrome on a reticle. Note that if the exposure system has 5× reduction optics, then the dimensions of the test monitor structure on the reticle will shrink to ⅕ that size in the pattern printed in a photoresist layer on a wafer or substrate. The minimum CD required to be printed in photoresist for current technologies is in the range of 0.13 to 0.18 microns. However, it is understood that the minimum feature size needed for future technologies will shrink to below 0.10 microns. The test structure 50 described herein is compatible with all technologies since its smallest dimensions $d_4$ and $d_5$ are no smaller than the minimum feature size printed in the device pattern in the photoresist film.

Dimension $d_1$ is typically large enough to allow a minimum of three rectangular shapes 58 to be placed on one side of end 56 and may have a maximum size of several microns to allow seven or more rectangular shapes 58. Dimension $d_2$ may have a maximum length of several microns and may be as small as about 0.5 microns. Dimension $d_3$ is preferably at least five times the size of $d_4$. A number of test structures 50 may be grouped together on a reticle to allow for easy identification when observed with a CD-SEM for measurement purposes. One or more of the structures 50 are placed within pattern 18 on the reticle 16 in locations that are easy to identify but will not affect the performance of the device which is produced from the lithographic pattern 28.

One of the critical sections of the test structure 50 which is repeated at several places on the structure is a convex section 54 at the end of the protruding rectangular shapes 58. This section appears on reticle 16 as chrome that is bounded on three sides by a space with no chrome. A second critical section that is repeated at several places within structure 50 is a concave section 52 which is a region of rectangular end 56 that connects two protruding rectangular shapes 58.

Figure 3A:
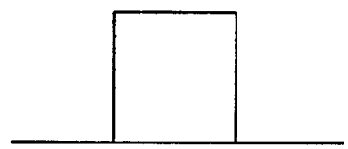
FIG. 3A–3C are cross sectional views of photoresist features after exposure and development.
Figure 3B:
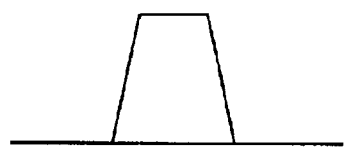
Figure 3C:
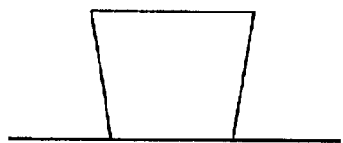

FIGS. 3A–3C are cross sectional views of photoresist profiles which would be observed if a wafer is cleaved after the lithographic process and a scanning electron microscope (SEM) is used to take a picture of a feature from an angle located near the plane of the wafer. FIG. 3A depicts a feature as printed in a photoresist film which has a vertical profile or sidewall. FIG. 3B shows a feature that has a tapered profile where the top of the feature is narrower than the bottom part. This type is normally produced at a positive defocus condition. FIG. 3C shows a feature that has a re-entrant profile where the top of the feature is wider than the bottom part. This type is normally produced at a negative defocus condition. All three are typical of profiles produced in a lithographic process. Generally, a vertical profile is preferred since it allows a more accurate CD measurement with commonly used CD-SEM scanning electron microscopes in a manufacturing line. The vertical profile is also an excellent mask shape for subsequent process steps such as etch transfer of the pattern into an underlying layer.

The CD-SEM takes a top down view, perpendicular to the wafer plane, of the pattern that has been printed in the photoresist film. It is useful in measuring the width (CD) of photoresist features without damaging the wafer. If the measured CD is within the specifications for the device, then the manufacturing process is allowed to proceed. If the feature size is too large or too small, a correction is made in the process on subsequent wafers to avoid reworking the wafers. Rework involves stripping the photoresist, recoating, and re-exposing and is undesirable because it lowers throughput and increases manufacturing cost.

Figure 4A:
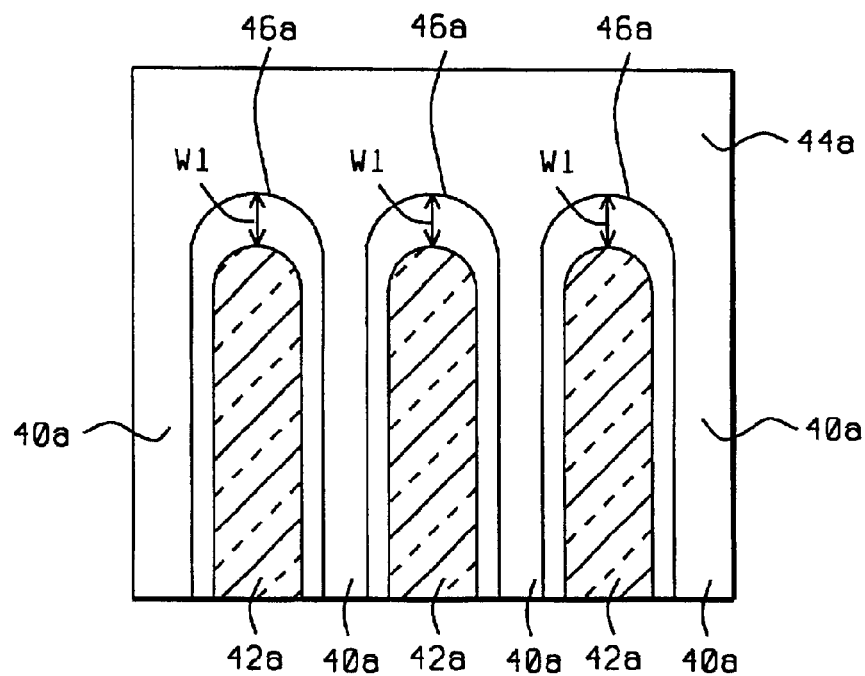
FIG. 4A is a top down view showing a concave section of the test structure as printed in photoresist at negative defocus.

Referring to FIG. 4A, the drawing is a top down view of the test structure printed in a photoresist film as it might appear in a CD-SEM image. The photoresist film has been exposed at a negative defocus condition of −0.4 microns and was developed in aqueous base solution. The test structure is a very small part of the device pattern designated as 28 in FIG. 1. Large rectangular end 44a and four extensions 40a are photoresist that has not been removed and typically appear as a gray color in the CD-SEM. Rectangular end 44a is the lithographic result of rectangular end 56 on the reticle in FIG. 2 while extension 40a is the lithographic result of rectangular shape 58. Note that the square corners in the test structure design (FIG. 2) are printed with rounded corners in the photoresist pattern because of imperfections in the lithographic process. The edge width $w_1$ of the photoresist film in the concave sections 46a is measured at the end of space 42a as shown in FIG. 4a and usually appears as a light or white color in the CD-SEM while adjacent regions are a darker color. Regions 42a are gray areas representing substrate where the photoresist was dissolved and removed by the aqueous base developer. Preferably, a measurement is done at the end of a space that is near the center of the test monitor structure and not near the edge where a proximity effect can influence the edge width $w_1$. It is also desirable to do take more than one data point which involves measuring several $w_1$ distances at several 46a locations.

FIG. 4A represents the result of printing a pattern in a photoresist film at one particular focus setting. In reality, the test structure is normally printed at various focus settings on the same substrate and at different locations on the substrate. For example, the test structure may be printed in photoresist using eleven different focus settings from +0.5 microns to −0.5 microns in 0.1 micron increments. Each of the test structures are exposed in a different location in a row on a substrate and processed in aqueous developer simultaneously to form the patterns in photoresist. The edge width $w_x$ in each concave section and edge width $w_y$ in each convex section of every test structure varies depending on the focus setting. Within each test structure in the focus matrix, edge width $w_x$ is preferably measured at more than one concave section and edge width $w_y$ is preferably measured at more than one convex section to determine best focus. It is understood that the best focus setting for a lithographic process is normally defined as an offset in microns from a focal plane determined by a calibration method within the exposure tool. Generally, F=0 or a focus offset of 0 microns is the focal plane corresponding to the top of the photoresist film which should provide the optimum process window. The focal plane or best focus for a process may shift slightly in a positive or negative direction depending on factors such as the type of photoresist, type of feature to be printed and the nature of the underlying layers.

Figure 4B:
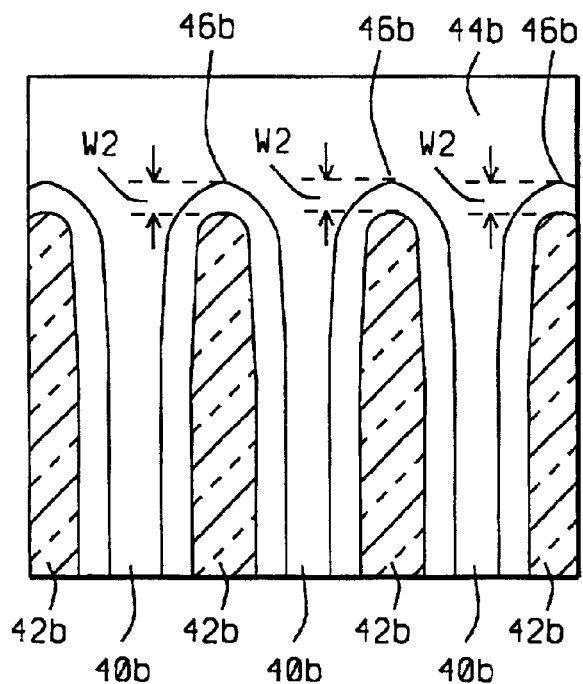
FIG. 4B is a top down view showing a concave section of the test structure as printed in photoresist at positive defocus.

FIG. 4B is a top down view from a CD-SEM showing concave sections 46b of the test structure that have been printed at a positive defocus setting of +0.4 microns. The large rectangular end 44b and extensions 40b are photoresist regions that have not been removed by developer. Regions 42b are gray areas representing substrate where the photoresist has been dissolved and removed by the aqueous base developer. Edge width $w_2$ at the end of space 42b and located at a concave section 46b is measured in at least one concave section 46b of the structure and preferably in several 46b sections near the center of the printed test structure pattern. In a similar manner, edge widths $w_x$ from concave sections 46x (not shown) within each of the test structures printed at different focus settings can be measured. A CD-SEM may be programmed to go to a specific (x,y) coordinates on the substrate corresponding to each test structure printed at a different focus setting. Within each test structure, the CD-SEM can be programmed to take a measurement at several concave and convex sections. By averaging a larger number of data points for each focus setting, a more reliable determination of best focus can be achieved.

Figure 5A:
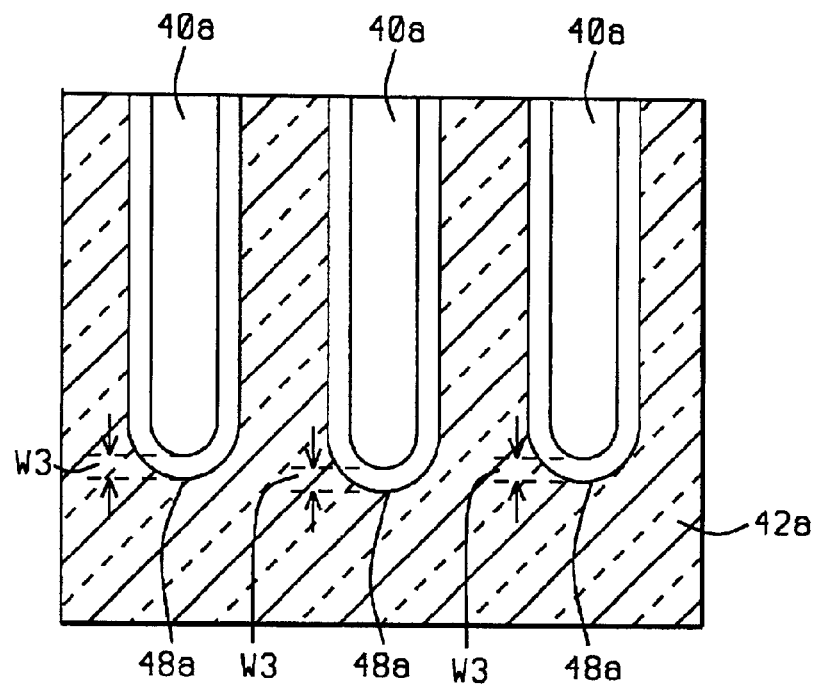
FIG. 5A is a top down view of a convex section of the test structure as printed in photoresist at negative defocus.

FIG. 5A is a top down view showing convex sections of the test structure as printed in photoresist at a −0.4 micron focus setting. The view in FIG. 5A is actually a continuation below the bottom of FIG. 4A which shows the ends of extensions 40a that terminate at line ends 48a where edge widths $w_3$ are measured. Line end 48a is a convex section that is the lithographic result of convex section 54 on the reticle. The photoresist has been removed by developer in regions 42a. Edge width $w_3$ is measured by CD-SEM in at least one convex section 48a and preferably in several convex sections 48a in the test structure. It is desirable to measure edge widths $w_3$ at line ends 48a that are located on extensions 40a near the center of the test structure and not at the edge of the pattern.

Figure 5B:
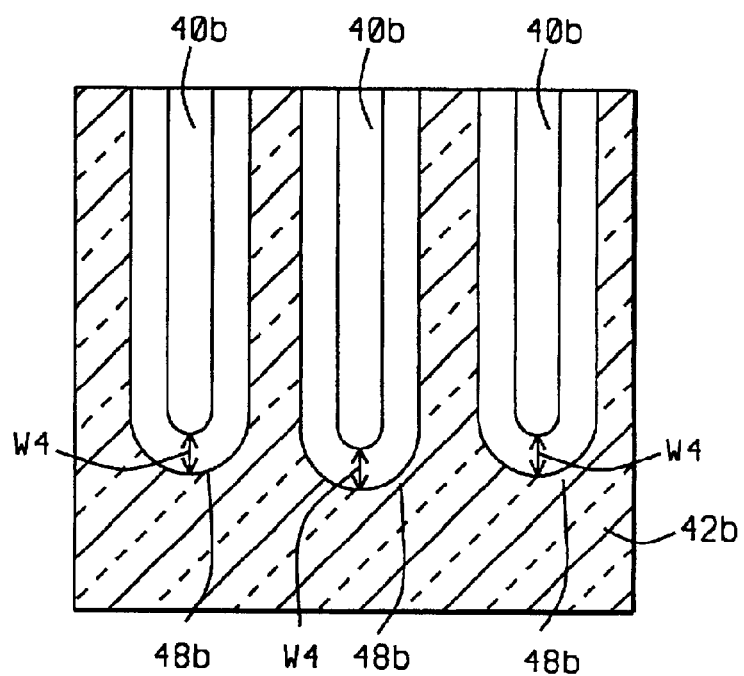
FIG. 5B is a top down view of a convex section of the test structure as printed in photoresist at positive defocus.

FIG. 5B is a top down view showing convex sections of the test structure as printed in photoresist at a +0.4 micron focus setting. The view in FIG. 5B is actually a continuation below the bottom of FIG. 4B which shows the ends of extensions 40b that terminate at line ends 48b where edge widths $w_4$ are measured. Line end 48b is a convex section that is the lithographic result of convex section 54 on the reticle. The photoresist has been removed by developer in regions 42b. Edge width $w_4$ is measured by CD-SEM in at least one convex section 48b and preferably in several convex sections 48b in the teststtructure. It is desirable to measure edge widths $w_4$ at line ends 48b that are located on extensions 40b near the center of the test structure and not at the edge of the pattern. In a similar manner, edge widths $w_y$ from convex sections 48y (not shown) within each of the test structures printed at different focus settings can be measured.

Figure 6:
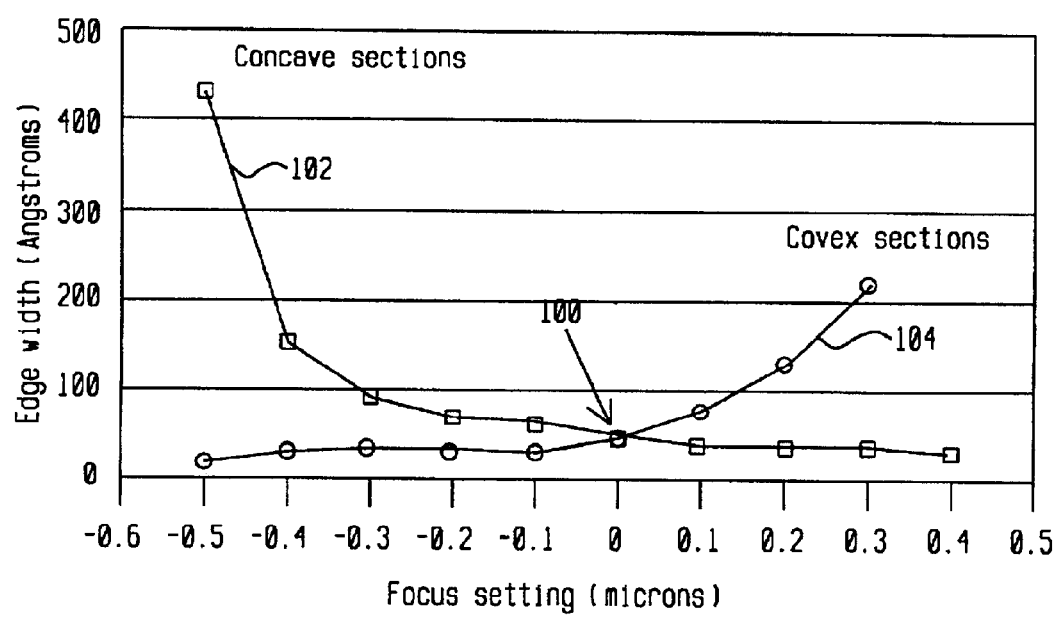
FIG. 6 is a plot of edge width measured by CD-SEM vs. defocus setting. The intersection of the two lines representing a convex and concave section indicates the best focus for the lithographic process.

FIG. 6 is a plot of edge widths $w_x$ from concave sections 46x and edge widths $w_y$ from convex sections 48y from the test structures resulting from a focus matrix that has 0.1 micron increments in focus shift. The collection of edge widths $w_x$ from concave sections such as $w_1$ in FIG. 4A and $w_2$ in FIG. 4B are used to form line 102. Likewise, the collection of edge widths $w_y$ from convex sections such as $w_3$ in FIG. 5A and $w_4$ in FIG. 5B are used to form line 104. In some cases, especially at the edge of the focus matrix, the offset in focus from the optimum focal plane may be too large and as a result the photoresist pattern deteriorates or may collapse so that data point is not available. The intersection 100 of the line representing concave section measurements 102 with the line representing convex section measurements 104 is defined as the best focus setting for the lithographic process.

Therefore, the usefulness of the test structure in determining the best focus setting for a lithographic process has been demonstrated and is not dependent upon the type of photoresist profile that is printed in the film.

In another embodiment, this invention is a method for determining the best focus setting for a lithographic process, said method comprising: (a) coating a photoresist on a substrate and baking to form a film; (b) exposing said film with radiation that passes through a reticle containing the test structure of the present invention in a device pattern, said exposures being repeated at different focus settings and in different locations in the photoresist film; (c) developing the photoresist film to produce the device pattern and test structure at various locations in the film that correspond to different focus conditions; (d) measuring the edge widths at the convex and concave sections of the test monitor structure formed at each focus condition with a CD-SEM; and (e) plotting edge width in Angstroms vs. focus setting in microns for the convex and concave sections wherein the intersection of the two lines on the plot corresponds to the best focus setting for the lithographic process.

FIG. 6 indicates that the edge width is measured at every 0.1 micron increment in focus setting. This type of plot is preferred when the DOF for the process is in the range of 0.5 to 1 micron or larger. However, if the lithographic process has a small DOF near 0.5 um or less, the focus settings on the exposure tool may be adjusted to provide finer increments of 0.05 microns. The range of defocus settings needed to generate a plot similar to FIG. 6 may be smaller to reduce the amount of CD-SEM measurements and increase the speed of the analysis.

The method of the present invention has an advantage over other methods in that the accuracy of the CD-SEM measurements do not depend on the shape of the photoresist profile. A CD-SEM may not give a true indication of the actual width or CD of a feature if it has a reentrant profile. However, edge width measurements of the convex and concave sections of the test structure are independent of profile and can be readily measured and plotted. Small measurement errors are tolerable since the critical determination of best focus relies on the intersection of two lines and not on an absolute CD measurement at a particular focus condition. The measurements of a test structure also do not require a tilted angle SEM to determine the angle of the profile or cleaving the wafer to correlate a cross section measurement to a CD-SEM result. The method of the present invention can be automated to minimize disruption to a manufacturing process and provides increased reliability and throughput over other methods.

While this invention has been particularly shown and described with reference to, the preferred embodiments thereof, it will be understood by those skilled in the art that various changes in form and details may be made without departing from the spirit and scope of this invention.

We claim:

1. A test structure on a reticle for monitoring the best focus setting in a lithographic process on a substrate, said structure comprising:

a large rectangular chrome end, and several rectangular chrome shapes of equal length and equal width attached to one side of said large rectangular end and extending in a parallel array wherein the spacing between the rectangular shapes is equal to the minimum feature size in the device pattern to be monitored and is equal to the width of said rectangular shapes.

2. The test structure of claim 1 wherein said structure is included in at least one area of the device pattern on said reticle.

3. The test structure of claim 2 further comprising several test structures on said reticle which are preferably grouped or clustered to allow easy identification when viewed with a CD-SEM measurement tool.

4. The test structure of claim 2 wherein said reticle is a bright field reticle comprised of chrome on a quartz plate.

5. The test structure of claim 2 wherein said reticle is a dark field reticle comprised of chrome on a quartz plate.

6. The test structure of claim 2 wherein said reticle contains phase shifting material.

7. The test structure of claim 2 wherein the dimension of said large rectangular end is preferably several microns wide to allow several rectangular shape extensions from one side.

8. The test structure of claim 2 wherein said reticle is constructed of materials that are compatible with X-ray, electron beam, EUV, or ion beam exposures.

9. The test structure of claim 2 wherein the length of said rectangular shape extending from said large rectangular end is at least five times the size of the width of said rectangular shape.

10. A test structure in a photoresist layer on a substrate for monitoring the best focus setting in a lithographic process, said structure comprising:
a large rectangular end, and
several extensions of equal length and equal width attached to one side of said large rectangular end and extending in a parallel array wherein the spacing between the extensions is equal to the minimum feature size in the device pattern to be monitored and is equal to the width of said extensions.

11. The test structure of claim 10 wherein the pattern has been produced using a broadband mercury lamp or laser energy source that emits a wavelength in the range of about 157 nm to about 600 nm.

12. The test structure of claim 10 wherein the pattern has been produced in materials sensitive to X-ray, electron beam, EUV, or ion beam energy sources.

13. The test structure of claim 10 wherein the pattern has been produced in positive tone photoresist wherein the imaging layer has been selected from a group including single layer, bilayer, multilayer and surface imaging photoresist.

14. The test structure of claim 10 wherein the pattern has been produced in negative tone photoresist wherein the imaging layer has been selected from a group including single layer, bilayer, multilayer, and surface imaging photoresist.

15. The test structure of claim 10 wherein the structure from a top down view in a CD-SEM has a darker inner portion representing the resist film remaining on the substrate and a lighter outer portion representing the edge width of the photoresist material.

16. The test structure of claim 10 wherein the structure has at least one convex section at the end of an extension which is photoresist remaining on the substrate.

17. The test structure of claim 10 wherein the structure has at least one concave section which is a region of said large rectangular end that connects two photoresist extensions.

18. A method of monitoring the best focus condition for a lithographic process, said method comprising:
lithographically transferring a test structure from a reticle into a photoresist layer on a substrate, said test structure comprising at least one large rectangular end and several rectangular shapes of equal length and equal width attached to one side of the large rectangular end and extending in a parallel array wherein the spacing between the rectangular shapes is equal to the minimum feature size in the pattern to be monitored and is equal to the width of said shapes,
measuring the edge width of at least one convex and one concave section of the test structure with a CD-SEM, said structure having been generated at various locations in the photoresist film using a range of focus settings in an exposure tool, and
determining the intersection of a line representing the edge widths from concave sections and a line representing the edge widths from convex sections in a plot of edge width as a function of exposure focus settings used to print the pattern.

19. The method of claim 18 wherein the CD-SEM magnification is 120K, voltage is 800 V, and number of edge width measurements within each test structure is preferably more than one per convex section and more than one per concave section.

20. The method of claim 19 wherein said CD-SEM measurements are taken at convex and concave sections that are not at the edge of the structure, said convex sections being located between two other convex sections on the same structure, and said concave sections being located between two other concave sections on the same structure.

21. The method of claim 18 wherein said focus settings are at 0.1 micron increments and best focus is determined to the nearest 0.1 um setting.

22. The method of claim 18 wherein the CD-SEM measurement edge width measurement is controlled to 50 Angstroms (5 nm) to allow determining best focus to the nearest 0.05 micron setting.

23. The method of claim 18 wherein said test structure is repeated at several locations on said reticle to allow for easy identification of said test structure in a photoresist pattern as viewed through a CD-SEM.

24. The method of claim 18 wherein the CD-SEM is programmed to take measurements at certain points in the photoresist pattern corresponding to test structure locations.

25. The method of claim 18 wherein CD-SEM measurements of more than edge width per focus setting are averaged to determine the CD for each convex and concave section data point on said plot.

26. The method of claim 18 wherein the lithography process is part of a manufacturing process to produce an integrated circuit in a microelectronics device.

* * * * *